(12) United States Patent
Hiramatsu et al.

(10) Patent No.: US 9,082,707 B2
(45) Date of Patent: Jul. 14, 2015

(54) SEMICONDUCTOR DEVICE AND METHOD FOR MANUFACTURING SEMICONDUCTOR DEVICE

(75) Inventors: Seiki Hiramatsu, Tokyo (JP); Mamoru Terai, Tokyo (JP)

(73) Assignee: Mitsubshi Electric Corporation, Tokyo (JP)

( * ) Notice: Subject to any disclaimer, the term of this patent is extended or adjusted under 35 U.S.C. 154(b) by 112 days.

(21) Appl. No.: 13/880,584

(22) PCT Filed: May 9, 2011

(86) PCT No.: PCT/JP2011/060639
§ 371 (c)(1),
(2), (4) Date: Apr. 19, 2013

(87) PCT Pub. No.: WO2012/070261
PCT Pub. Date: May 31, 2012

(65) Prior Publication Data
US 2013/0240909 A1    Sep. 19, 2013

(30) Foreign Application Priority Data

Nov. 25, 2010  (JP) ................................ 2010-262407

(51) Int. Cl.
*H01L 23/29* (2006.01)
*H01L 23/24* (2006.01)
(Continued)

(52) U.S. Cl.
CPC ............... *H01L 23/29* (2013.01); *H01L 21/56* (2013.01); *H01L 23/24* (2013.01); *H01L 23/293* (2013.01);
(Continued)

(58) Field of Classification Search
CPC ........ H01L 23/29; H01L 23/293; H01L 21/56; H01L 29/1602; H01L 29/1608; H01L 23/3135; H01L 25/072; H01L 23/562; H01L 23/3121; H01L 23/24; H01L 24/49; H01L 24/73
USPC .......................................................... 257/77
See application file for complete search history.

(56) References Cited

U.S. PATENT DOCUMENTS

2007/0246833 A1   10/2007   Soga et al.
2008/0258316 A1   10/2008   Tamba et al.
2009/0096081 A1    4/2009   Soyano

FOREIGN PATENT DOCUMENTS

JP   58 17646     2/1983
JP   7 283441    10/1995
(Continued)

OTHER PUBLICATIONS

Office Action issued Apr. 1, 2014 in Japanese Patent Application No. 2012-545627 (with partial English language translation).
(Continued)

*Primary Examiner* — Ermias Woldegeorgis
(74) *Attorney, Agent, or Firm* — Oblon, McClelland, Maier & Neustadt, L.L.P.

(57) ABSTRACT

A semiconductor device includes a semiconductor element substrate, wherein an electrode pattern is formed on one surface of an insulating substrate and a back-surface electrode is formed on the other surface of the insulating substrate; a stress-relaxation adhesive layer made of resin that covers at least a part of a portion of the surface of the insulating substrate where the electrode pattern and the back-surface electrode are not formed; and a semiconductor element affixed, using a bonding material, to the surface of the electrode pattern opposite the insulating substrate, and a first sealing resin member which covers the semiconductor element and the semiconductor element substrate, and a modulus of elasticity of the stress-relaxation adhesive layer is lower than that of the first sealing resin member.

17 Claims, 11 Drawing Sheets

(51) Int. Cl.
  *H01L 23/31* (2006.01)
  *H01L 23/00* (2006.01)
  *H01L 25/07* (2006.01)
  *H01L 21/56* (2006.01)
  *H01L 29/16* (2006.01)
  *H01L 23/373* (2006.01)

(52) U.S. Cl.
  CPC ........ *H01L 23/3121* (2013.01); *H01L 23/3135* (2013.01); *H01L 23/3735* (2013.01); *H01L 23/562* (2013.01); *H01L 25/072* (2013.01); *H01L 29/1602* (2013.01); *H01L 29/1608* (2013.01); *H01L 2224/32225* (2013.01); *H01L 2224/48091* (2013.01); *H01L 2224/48227* (2013.01); *H01L 2224/48247* (2013.01); *H01L 2224/49109* (2013.01); *H01L 2224/73265* (2013.01); *H01L 2924/13091* (2013.01); *H01L 2924/19107* (2013.01)

(56) References Cited

FOREIGN PATENT DOCUMENTS

| | | | |
|---|---|---|---|
| JP | 2000 223623 | | 8/2000 |
| JP | 2000223623 A | * | 8/2000 |
| JP | 2003 124401 | | 4/2003 |
| JP | 2005-056873 A | | 3/2005 |
| JP | 2006-032617 A | | 2/2006 |
| JP | 2007 250703 | | 9/2007 |
| JP | 2009-070863 A | | 4/2009 |
| JP | 2009 289920 | | 12/2009 |
| JP | 2009289920 A | * | 12/2009 |
| JP | 2010 141158 | | 6/2010 |

OTHER PUBLICATIONS

German Office Action issued Sep. 15, 2014 in Patent Application No. 11 2011 103 926.3 (with English Translation).
International Search Report Issued Aug. 2, 2011 in PCT/JP11/60639 Filed May 9, 2011.

* cited by examiner

|  | Example 1-1 | Example 1-2 | Example 1-3 | Example 1-4 | Example 1-5 | Example 1-6 |
|---|---|---|---|---|---|---|
| Modulus of elasticity of stress-relaxation adhesive layer | 15KPa | 30kPa | 3.5MPa | 900MPa | 1000MPa | 1200MPa |
| Life on power cycle test (Cycles) | 100000 | 180000 | 200000 | 190000 | 100000 | 80000 |
| Life on heat cycle test (Cycles) | 100 | 600 | 1000 | 800 | 200 | 150 |

FIG. 12

|  | Example 2-1 | Example 2-2 | Example 2-3 | Example 2-4 | Example 2-5 |
|---|---|---|---|---|---|
| Modulus of elasticity of stress-relaxation adhesive layer | 15KPa | 30kPa | 3.5MPa | 900MPa | 1000MPa |
| Life on power cycle test (Cycles) | 110000 | 200000 | 210000 | 200000 | 120000 |
| Life on heat cycle test (Cycles) | 200 | 700 | 1100 | 1000 | 200 |

FIG. 13

|  | Example 3-1 | Example 3-2 | Example 3-3 | Example 3-4 | Example 3-5 | Example 3-6 | Example 3-7 |
|---|---|---|---|---|---|---|---|
| Modulus of elasticity of first sealing resin member | 900MPa | 1GPa | 7GPa | 12GPa | 14GPa | 20GPa | 22GPa |
| Life on power cycle test (Cycles) | 90000 | 160000 | 180000 | 160000 | 140000 | 110000 | 100000 |
| Life on heat cycle test (Cycles) | 50 | 300 | 800 | 600 | 500 | 450 | 200 |

FIG. 14

|  | Example 4-1 | Example 4-2 | Example 4-3 | Example 4-4 | Example 4-5 | Example 4-6 | Example 4-7 |
|---|---|---|---|---|---|---|---|
| Modulus of elasticity of first sealing resin member | 900MPa | 1GPa | 7GPa | 12GPa | 14GPa | 20GPa | 22GPa |
| Life on power cycle test (Cycles) | 100000 | 180000 | 190000 | 180000 | 140000 | 110000 | 100000 |
| Life on heat cycle test (Cycles) | 100 | 400 | 900 | 800 | 600 | 500 | 250 |

FIG. 15

|  | Example 5-1 | Example 5-2 | Example 5-3 | Example 5-4 | Example 5-5 | Example 5-6 | Example 5-7 |
|---|---|---|---|---|---|---|---|
| Modulus of elasticity of first sealing resin member | 900MPa | 1GPa | 7GPa | 12GPa | 14GPa | 20GPa | 22GPa |
| Life on power cycle test (Cycles) | 90000 | 170000 | 190000 | 160000 | 140000 | 110000 | 100000 |
| Life on heat cycle test (Cycles) | 100 | 400 | 800 | 600 | 500 | 450 | 200 |

FIG. 16

SEMICONDUCTOR DEVICE AND METHOD FOR MANUFACTURING SEMICONDUCTOR DEVICE

TECHNICAL FIELD

This invention relates to a semiconductor device, especially to the mounting configuration of the semiconductor device which operates at high temperatures.

BACKGROUND ART

With the development of industrial equipment, electric railroads and automobiles, operation temperatures of semiconductor elements which are used for them have been increased. Recently, development for semiconductor elements which operate even at high temperatures has been carried out energetically, and reduction in the size, increase in the withstand voltage and increase in the current density of the semiconductor elements has been progressed. Particularly, wide band gap semiconductors such as SiC, GaN, etc. have a larger band gap than that of Si semiconductors. Therefore, increase in the withstand voltage, reduction in the size, increase in the current density, and operation at high temperatures of semiconductor devices has been expected. In order to produce a device by using the semiconductor element having the above-mentioned features, even in a case where the semiconductor element operates at a temperature higher than 150 degrees Celsius, it is necessary to secure stable operation of the semiconductor device by suppressing formation of a crack on a bonding material and degradation of wirings.

On the other hand, as a method for sealing a semiconductor element with a resin in a semiconductor device, Patent Document 1 proposes a method in which a dam material is used to enclose the periphery of a semiconductor element so as to seal a part of its inside with a resin. Further, Patent Document 2 proposes a method in which a dam is formed in the periphery of a semiconductor element for stopping the flow of a resin which covers the semiconductor element.

PRIOR ART REFERENCE

Patent Document

Patent Document 1: JP 2003-124401A
Patent Document 2: JP 58-17646A

DISCLOSURE OF THE INVENTION

Problems to be Solved by the Invention

However, according to the methods which are disclosed in Patent Document 1 and Patent Document 2, a semiconductor element is a wide band gap semiconductor element such as SiC, etc. and a semiconductor device comprising the wide band gap semiconductor element operates at higher temperatures than before, and a temperature of a heat cycle test becomes higher corresponding to the above-mentioned. Under the above-mentioned conditions, formation of a crack on a sealing resin member occurs, or separation of a sealing resin member from a substrate occurs. As a result, reliability of a semiconductor device has been seriously diminished.

This invention is made so as to solve the above-mentioned problems, and an objective of this invention is to obtain a high-reliability semiconductor device in which formation of a crack in a sealing resin member and separation of a sealing resin member from a substrate is hard to occur, even when subjected to heat cycles in which semiconductor elements repeatedly operate at high temperatures.

Means for Solving the Problems

According to this invention, a semiconductor device is provided with a semiconductor-element substrate wherein an electrode pattern is formed on one surface of an insulating substrate and a back-surface electrode is formed on the other surface of the insulating substrate; a stress-relaxation adhesive layer made of resin that covers at least a part of the portion of the surface of the insulating substrate where the electrode pattern and back-surface electrode are not formed; and semiconductor elements affixed, using a bonding material, to the surface of the electrode pattern opposite the insulating substrate and a sealing resin member which covers the semiconductor element and the semiconductor-element substrate, and a modulus of elasticity of the resin member constituting the stress-relaxation adhesive layer is lower than that of the sealing resin.

Advantage of the Invention

As a semiconductor device according to the invention has the above-mentioned configuration, when the semiconductor device operates at high temperatures, the stress which is generated on a sealing resin member is relaxed by a stress-relaxation adhesive layer, therefore, malfunction which is caused by operation at high temperatures is hard to occur. As a result, a semiconductor having high reliability can be obtained.

BRIEF DESCRIPTION OF THE DRAWINGS

FIG. 12 shows results of a power cycle test and a heat cycle test of a semiconductor device according to EXAMPLE 1 of this invention.

FIG. 13 shows results of a power cycle test and a heat cycle test of a semiconductor device according to EXAMPLE 2 of this invention.

FIG. 14 shows results of a power cycle test and a heat cycle test of a semiconductor device according to EXAMPLE 3 of this invention.

FIG. 15 shows results of a power cycle test and a heat cycle test of a semiconductor device according to EXAMPLE 4 of this invention.

FIG. 16 shows results of a power cycle test and a heat cycle test of a semiconductor device according to EXAMPLE 5 of this invention.

EMBODIMENTS FOR CARRYING OUT THE INVENTION

Embodiment 1

Figure 1:
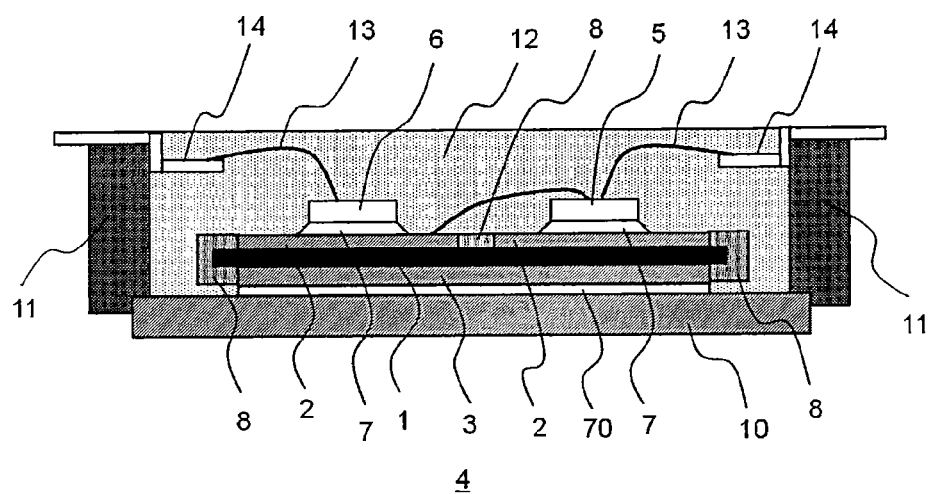
FIG. 1 is a cross-sectional view showing a basic configuration of a semiconductor device according to EMBODIMENT 1 of this invention.
Figure 2:
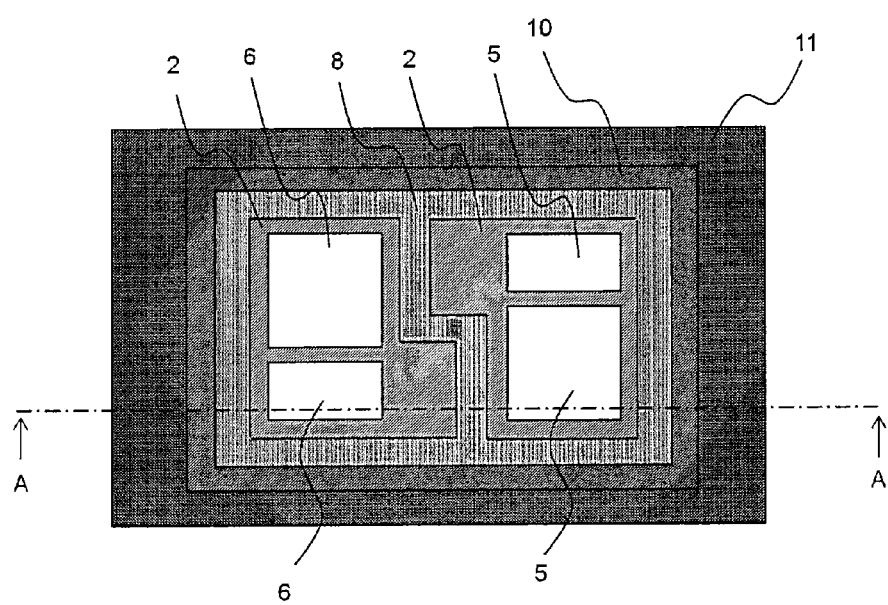
FIG. 2 is a top view showing a basic configuration of a semiconductor device according to EMBODIMENT 1 of this invention in which some components are removed.

FIG. 1 is a cross-sectional view showing a basic configuration of a semiconductor device according to EMBODIMENT 1 of this invention, and FIG. 2 is a top view showing the basic configuration of a semiconductor device according to EMBODIMENT 1 of this invention in which a first sealing resin member 12, wires 13 and terminals 14 are removed. FIG. 1 is a cross-sectional view taken on line A-A of FIG. 2, and shows the configuration including the first sealing resin member 12, wires 13 and terminals 14. A semiconductor device according to this invention is provided with a semiconductor-element substrate 4 wherein an electrode pattern 2 is formed on one surface of an insulating substrate 1 and a back-surface electrode 3 is formed on the other surface of the insulating substrate 1, and semiconductor elements 5 and 6 are affixed to the surface of the electrode pattern 2 using a bonding material 7 such as solder. Here, for example, the semiconductor element 5 is a power semiconductor element such as MOSFET which controls large amount of electric current, and the semiconductor element 6 is, for example, a return current diode—which is provided in parallel with the power semiconductor element 5. The side of a back-surface electrode 3 of the semiconductor-element substrate 4 is affixed to a base plate 10 using a bonding material 70 such as solder. The base plate 10 is a bottom plate, and the base plate 10 and a case side plate 11 form a case, and a first sealing resin 12 is injected into the case so as to perform molding of resin. Wires 13 are connected to each semiconductor element for electrically connecting to the outside, and the wires 13 are connected to terminals 14.

The semiconductor-element substrate 4 comprises the insulating substrate 1 on whose one surface, the electrode pattern 2 is formed and on whose another surface, the back-surface electrode 3 is formed, however, the insulating substrate 1 is not completely covered with the electrode pattern 2 and the back-surface electrode 3, and the semiconductor-element substrate 4 as a single unit has a portion in which the insulating substrate 1 is exposed. In EMBODIMENT 1 of this invention, a portion of the semiconductor-element substrate 4 in which the insulating substrate 1 is exposed is covered with a resin member whose modulus of elasticity is lower than that of the first sealing resin member 12. In this invention, a part of the resin member having a low elasticity (In FIG. 1, a part which is indicated by reference character 8) will be referred as a stress-relaxation adhesive layer.

When the semiconductor element according to this invention is applied to a semiconductor element which operates at temperatures higher than 150 degrees Celsius as a power semiconductor, not only in EMBODIMENT 1 but also other EMBODIMENTs, large effect can be obtained. Especially, when the semiconductor element is applied to so-called a wide band gap semiconductor, that is, a semiconductor which is formed of a material whose band gap is larger than that of silicon (Si), such as a silicon carbide, a gallium nitride based material, or diamond, large effect can be obtained. Further, in FIG. 2, only four semiconductor elements are mounted on one molded semiconductor device, however, it is not limited thereto, depending on the intended application, necessary number of semiconductor elements can be mounted on the semiconductor device.

In general, copper is used for the electrode pattern 2, the back-surface electrode 3, the base plate 10 and the terminal 14, however, it is not limited thereto, aluminum or iron may be used, or a material combining thereof may be used. Further, on a surface, in general, nickel plating is performed, however, it is not limited thereto, gold plating or tin plating may be performed, and any constitution which can supply necessary current and voltage to a semiconductor element is acceptable. Further, a composite material such as copper/Invar/copper may be used, and an alloy such as SiCAl or CuMo may be used. Further, the terminal 14 and the electrode pattern 2 are embedded in the first sealing resin member 12, therefore, in order to improve the adhesion with the resin member, minute recesses and projections may be formed on a surface, and an adhesion auxiliary layer may be formed by using a silane coupling agent.

The semiconductor-element substrate 4 refers to a substrate comprising the insulating substrate 1 made of a ceramic such as $Al_2O_3$, $SiO_2$, AlN, BN, $Si_3N_4$, etc. wherein the electrode pattern 2 and the back-surface electrode 3 made of copper or aluminum are formed. It is necessary for the semiconductor-element substrate 4 to have both of heat radiation and insulating quality. The configuration of the semiconductor-element substrate 4 is not limited to the above, the semiconductor-element substrate 4, comprising the insulating substrate 1 which is a resin cured product in which ceramic powder is dispersed or in which a ceramic plate is embedded wherein the electrode pattern 2 and the back-surface electrode 3 are formed, is acceptable. Further, as ceramic powder which is used for the insulating substrate 1, $Al_2O_3$, $SiO_2$, AlN, BN, $Si_3N_4$, etc. is used, however, it is not limited thereto, diamond, SiC, $B_2O_3$, etc. may be used. Further, resin powder such as a silicone resin, an acrylic resin, etc. may be used. Regarding a shape of a grain of powder, in many cases, powder having a spherical shape is used, however, it is not limited thereto, a grain having a crushed shape, a granular shape, a phosphorous scale shape, and an aggregate of powder, etc. may be used. Regarding the filling amount of powder, any amount of filling by which necessary heat radiation and insulating quality can be obtained is acceptable. In general, a resin which is used for the insulating substrate 1 is an epoxy resin, however, it is not limited thereto, a polyimide resin, a silicone resin, an acrylic resin, etc. may be used, that is, a material which has both of insulating quality and adhesion is acceptable.

The wires 13 which are wire bodies having a circular cross section made of aluminum or gold are used; however, it is not limited thereto. For example, a wire, which is made by forming a copper plate into a belt-like shape may be used. Further, in FIG. 1, only three wires are connected on a semiconductor element, however, it is not limited thereto, necessary number of wires can be connected depending on the current density of the semiconductor element, etc. Further, the wire 13 may be formed by connecting a piece of a metal such as copper or tin with a molten metal, any configuration of a wire which can supply necessary current and voltage to a semiconductor element is acceptable.

For a stress-relaxation adhesive layer 8, for example, a silicone resin is used, however, it is not limited thereto, an urethane resin, an acrylic resin, etc. can be used.

Further, ceramic powder such as $Al_2O_3$, $SiO_2$, etc. may be added to a resin, however, it is not limited thereto, AlN, BN, $Si_3N_4$, diamond, SiC, $B_2O_3$, etc. may be added, and resin powder such as a silicone resin or an acrylic resin may be added. Regarding a shape of a grain of powder, in many cases, a grain of powder having a spherical shape is used, however, it is not limited thereto, a grain of powder having a crushed shape, a granular shape, a phosphorous scale shape, and an aggregate of powder, etc. may be used. Regarding the filling amount of powder, any amount of filling by which necessary flow-ability, insulating quality and adhesion can be obtained is acceptable. However, a modulus of elasticity of the stress-relaxation adhesive layer 8 should be lower than that of the first sealing resin member 12.

When a semiconductor element operates at high temperatures, the first sealing resin member 12 which is formed in the periphery of the semiconductor element and the semiconductor-element substrate 4 are thermally expanded and when the semiconductor element stops operation, thermal contraction occurs. That is, a heat cycle is caused. The first sealing resin member 12 is adjusted to have the coefficient of linear thermal expansion which is close to that of a material of the electrode pattern 2 and the back-surface electrode 3 (for example, copper) among the materials constituting the semiconductor-element substrate 4, therefore, the coefficient of linear thermal expansion of the first sealing resin member 12 is different from that of the insulating substrate 1. In conventional semiconductor devices, a portion-of the insulating substrate 1 where the electrode pattern 2 and the back-surface electrode 3 are not formed, directly contacts the first sealing resin member 12. After a heat cycle is caused repeatedly, due to the difference of coefficient of linear thermal expansion between them, at a portion where the first sealing resin member 12 and the insulating substrate 1 are contacted, formation of a crack in the first sealing resin member 12 and separation of the first sealing resin member 12 from the substrate 1 occur. As a result, reliability of semiconductor devices has been remarkably decreased. However, according to a semiconductor device in EMBODIMENT 1 of this invention shown in FIG. 1, in the semiconductor-element substrate 4 as a single unit, before the substrate 4 is covered with the first sealing resin member 12, the stress-relaxation adhesive layer 8 having a lower modulus of elasticity than that of the first sealing resin member 12 is formed at a portion where the insulating substrate 1 is exposed. Consequently, when a heat cycle is caused, at a part of the stress-relaxation adhesive layer 8 which has a lower modulus of elasticity than that of the first sealing resin member 12, stress which is generated by the difference of coefficient of linear thermal expansion between them is relaxed, and formation of a crack in the first sealing resin member 12 and separation of the first sealing resin member 12 is hard to occur. As a result, a semiconductor device having high reliability can be obtained.

Further, in the configurations of a semiconductor device shown in FIG. 1 and FIG. 2, an exposed portion of the insulating substrate 1 in the semiconductor-element substrate 4 is entirely covered with the stress-relaxation adhesive layer 8, as a result, any portion of the insulating substrate 1 is not contacted with the first sealing resin member 12. However, in the semiconductor-element substrate 4, it is not necessary to entirely cover the exposed portion of the insulating substrate 1 with the stress-relaxation adhesive layer 8. It is sufficient to cover a part of an exposed portion of the insulating substrate 1 in the semiconductor element 4, preferably, 80% or more of the exposed area with the stress-relaxation adhesive layer 8. When an exposed portion of the insulating substrate 1 in the semiconductor-element substrate 4 is 20% or lower, the effect of preventing separation of the first sealing resin member 12 or preventing formation of a crack on the first sealing resin member 12 is sufficient.

Further, the stress-relaxation adhesive layer 8 may cover an upper surface of the electrode pattern 2; however, it is preferable such that the area of the electrode pattern 2 which is covered with the stress-relaxation adhesive layer 8 is 50% or less of the surface area of the electrode pattern 2. When the covered area exceeds 50%, the area where the first sealing resin member 12 bonds to the electrode pattern 2 is reduced, and the force of pushing the semiconductor-element substrate 4, the semiconductor elements 5 and 6 by the first sealing resin member 12 is reduced. Consequently, when a heat cycle is caused, the bonding material 70 is separated; as a result, there is the possibility such that reliability of a semiconductor device is reduced.

Embodiment 2

Figure 3:
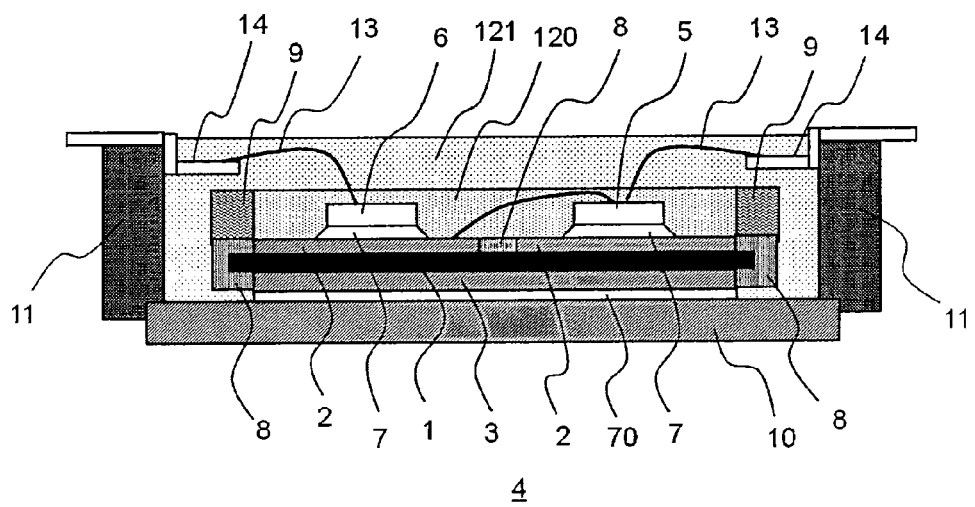
FIG. 3 is a cross-sectional view showing a basic configuration of a semiconductor device according to EMBODIMENT 2 of this invention.
Figure 4:
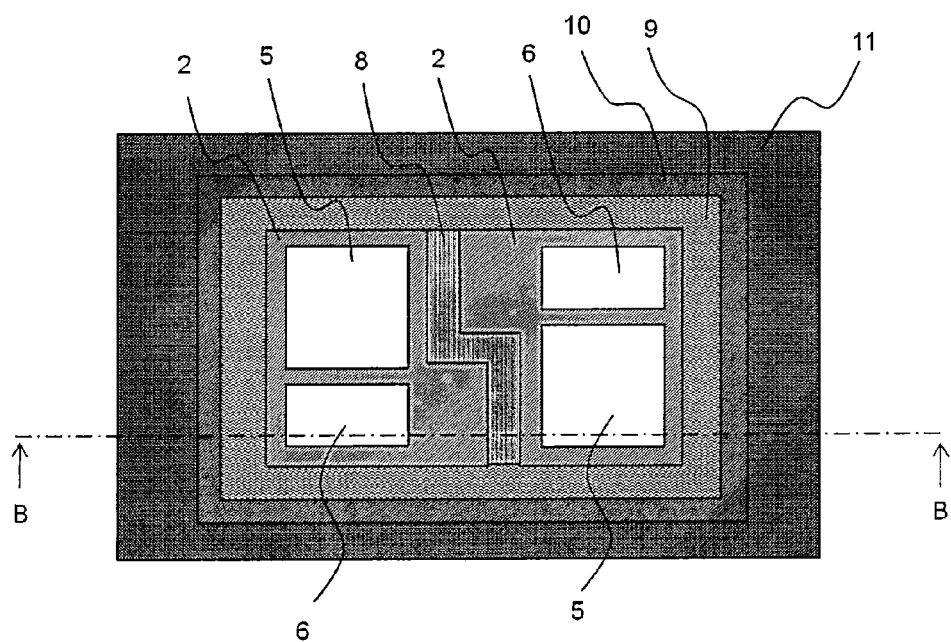
FIG. 4 is a top view showing a basic configuration of a semiconductor device according to EMBODIMENT 2 of this invention in which some components are removed.

FIG. 3 is a cross-sectional view showing a basic configuration of a semiconductor device according to EMBODIMENT 2 of this invention. In FIG. 3, the same reference character as that in FIG. 1 indicates the same or a corresponding part. As shown in FIG. 3, in Embodiment 2, in addition to a stress-relaxation adhesive layer 8 in EMBODIMENT 1, a partition wall 9 made of resin is formed so as to enclose the periphery of a semiconductor-element substrate 4. An inside region which is separated by the partition wall 9 is covered with a first sealing resin member 120. Further, the outside of the first sealing resin member 120 and the partition wall 9 is covered with a second sealing resin member 121. FIG. 4 is a top view showing the basic configuration of a semiconductor device in which the first sealing resin member 120, the second sealing resin member 121, terminals 14 and wires 13 are removed. FIG. 3 is a cross-sectional view taken on line B-B of FIG. 4, and shows the configuration including the first sealing resin member 120, the second sealing resin member 121, the terminals 14 and the wires 13.

As a material for the partition wall 9, for example, a silicone resin is used, however, it is not limited thereto, a urethane resin, an acrylic resin, etc. can be used.

Further, a resin to which a ceramic powder such as $Al_2O_3$, $SiO_2$, etc. is added can be used, however, it is not limited thereto, AlN, BN, $Si_3N_4$, diamond, SiC, $B_2O_3$, etc. may be added, and resin powder such as a silicone resin, an acrylic resin, etc. may be added. Regarding the shape of a grain of powder, in many cases, a grain of powder having a spherical shape is used, however, it is not limited thereto, a grain of powder having a crushed shape, a granular shape, a phosphorous scale shape, and an aggregate of powder etc. may be used. Regarding the filling amount of powder, any amount of filling by which necessary flow-ability, insulating quality and adhesion can be obtained is acceptable. However, a modulus of elasticity of the partition wall 9 should be lower than that of the first sealing resin member 120. Further, different materials may be used for the partition wall 9 and the stress-relaxation adhesive layer 8; however, it is preferable to use the same material for them. In a case where the different materials are used, the materials for the partition wall 9 and the stress-relaxation adhesive layer 8 should adhere to each other.

Figure 5:
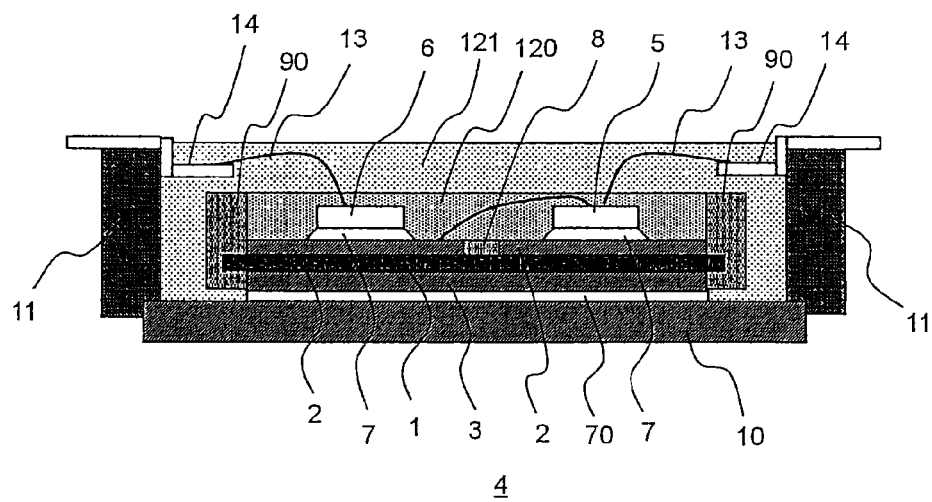
FIG. 5 is a cross-section view showing another basic configuration of a semiconductor device according to EMBODIMENT 2 of this invention.

FIG. 5 is a cross-sectional view showing a configuration of a semiconductor device in a case where a partition wall and a stress-relaxation adhesive layer are made of the same material. In FIG. 5, the same reference character as that in FIG. 1 and FIG. 3 indicates the same or a corresponding part. A semiconductor device shown in FIG. 5 has the configuration such that the stress-relaxation adhesive layer 8 which is formed high in the periphery part of the semiconductor-element substrate 4 so as to constitute the partition wall 90, therefore, the partition wall and the stress-relaxation adhesive layer are made of the same material. That is, a part of the partition wall 90 which covers the semiconductor-element substrate 4 also functions as a stress-relaxation adhesive layer.

Figure 6:
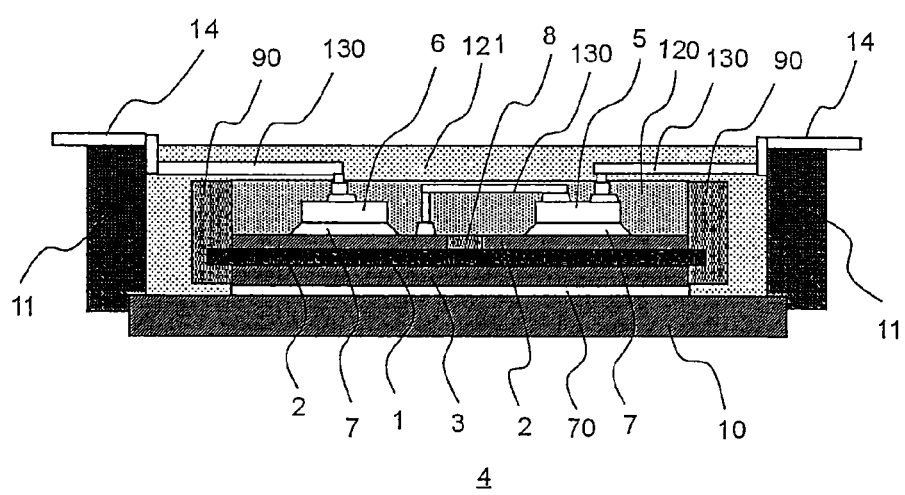
FIG. 6 is a cross-section view showing another basic configuration of semiconductor device according to Embodiment 2 of this invention.

Further, FIG. 6 shows an example in which a copperplate 130 is used as a wiring. In FIG. 6, the same reference character as that in FIG. 1, FIG. 3 and FIG. 5 indicates the same or a corresponding part. For rust prevention of a surface of the copper plate 130, nickel plating may be performed, and also a chemical treatment using a rust-preventive agent may be performed. Further, in order to improve the adhesion with each resin, irregularity may be formed on the surface, and a chemical treatment using a silane coupling agent may be performed. Here, an example in which a copperplate is used as a wiring is shown; however, it is needless to say such that any material other than copper, which can electrically connect to a terminal, which can also electrically connect to a semiconductor element and which can secure necessary current capacity, is acceptable.

When the height of the partition walls 9 and 90 is higher than that of semiconductor elements 5 and 6 so as for the first sealing resin member 120 to cover the semiconductor elements 5 and 6, and the height of the partition walls does not exceed the height of a case side plate 11 of a semiconductor device, any height is acceptable. In many cases, the size of the insulating substrate 1 is 100 mm×100 mm or smaller, therefore, it is preferable such that the width of the partition walls 9 and 90 is 1 to 2 mm; however, it is not limited thereto, any width which is necessary to separate the first sealing resin member 120 from outer region is acceptable.

As the second sealing resin member 121, for example, a silicone resin is used, however, it is not limited thereto, a urethane resin, an acrylic resin, etc. can be used.

Further, a ceramic powder such as $Al_2O_3$, $SiO_2$, etc. may be added to a resin, however, it is not limited thereto, AlN, BN, $Si_3N_4$, diamond, SiC, $B_2O_3$, etc. may be added, and resin powder such as a silicone resin or an acrylic resin may be added. Regarding a shape of a powder, in many cases, a powder having a spherical shape is used, however, it is not limited thereto, a powder having a crushed shape, a granular shape, a phosphorous scale shape, and an aggregate of a powder, etc. may be used. Regarding the filling amount of powder, any amount of filling by which necessary flow-ability, insulating quality and adhesion can be obtained is acceptable.

According to EMBODIMENT, 2, the partition wall 9 or 90 is formed in the periphery part of the semiconductor-element substrate 4 so as to cover the inside of the partition wall with the first sealing resin member 120, and the second sealing resin member 121 is formed so as to cover the partition wall 9 or 90 and the first sealing resin member 120. In addition to the stress-relaxation adhesive layer 8, the partition wall 9 or 90 and the second sealing resin member 121 are made by using a material whose modulus of elasticity is lower than that of the first sealing resin member 120. When the thermal stress is generated in a case where curing shrinkage is caused in the first sealing resin member 120 and when a heat cycle is caused, the stress is relaxed by a partition wall having a low modulus of elasticity. Consequently, the stress loading which is applied to the semiconductor-element substrate 4 is reduced. Further, in comparison with a case in which an outside of the semiconductor-element substrate 4 is sealed with a resin having the same modulus of elasticity of that of the first sealing resin member 120, when an outside of the semiconductor-element substrate 4 is sealed with the second sealing resin member 121 having a lower modulus of elasticity, the stress loading which is generated on a base plate and a semiconductor-element substrate is reduced. As a result, separation of the first sealing resin member 120 from the semiconductor-element substrate 4 and formation of a crack on the first sealing resin member 120 can be prevented, and a semiconductor having high reliability can be obtained.

Embodiment 3

Figure 7:
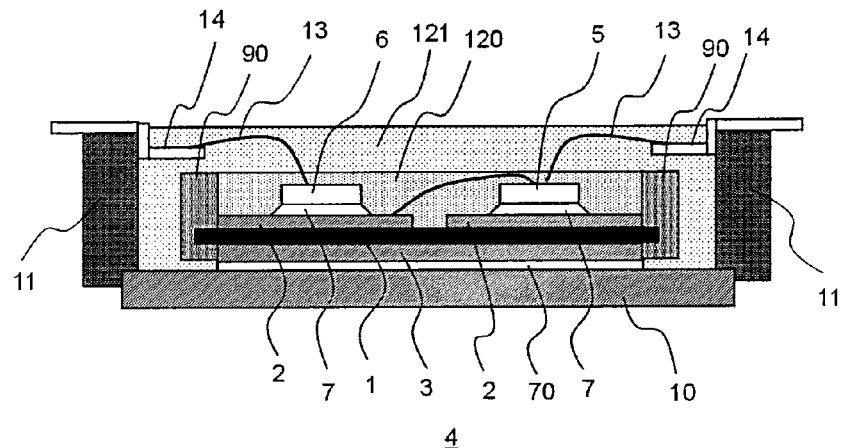
FIG. 7 is a cross-section view showing a basic configuration of a semiconductor device according to EMBODIMENT 3 of this invention.

FIG. 7 is a cross-sectional view showing the basic configuration of a semiconductor device according to EMBODIMENT 3 of this invention. In FIG. 7, the same reference character as that in FIG. 1, FIG. 3 and FIG. 5 indicates the same or a corresponding part. As shown in FIG. 7, in EMBODIMENT 3, a partition wall 90 made of resin whose modulus of elasticity is lower than that of a first sealing resin member 12 is formed so as to enclose the periphery of a semiconductor-element substrate 4. Further, in EMBODIMENT 3, at a portion of an upper surface of the semiconductor-element substrate 4 where an electrode pattern 2 is not formed, a stress-relaxation adhesive layer is not formed.

As above-mentioned, in EMBODIMENT 3, a stress-relaxation adhesive layer is not formed, and the partition wall 90 is formed so as to enclose the periphery of the semiconductor-element substrate 4, the inside of the partition wall 90 is covered with a first sealing resin member 120 and the outside of the partition wall 90 is covered with a second sealing resin member 121. The partition wall 90 and the second the sealing resin member 121 are made by using a material whose modulus of elasticity is lower than that of the first sealing resin member 120. By forming the partition wall, the amount of the first sealing resin is reduced, by using a resin having a low modulus of elasticity for the partition wall and the second sealing resin, the stress loading which is applied to a semiconductor-element substrate and a base plate can be reduced. Consequently, separation of the first sealing resin member 120 from the semiconductor-element substrate 4 and formation of a crack on the first sealing resin member 120 can be prevented. When a stress-relaxation adhesive layer is not formed, the thermal stress which is generated between the first sealing resin member 120 and an insulating substrate 1 is increased. Therefore, the effect is slightly decreased in comparison with that of EMBODIMENT 2. However, in comparison with a semiconductor device which does not have a partition wall, separation of the first sealing resin member 120 from the semiconductor-element substrate 4 and formation of a crack on the first sealing resin member 120 can be prevented, and as a result, a semiconductor having high reliability can be obtained.

Embodiment 4

Figure 8:
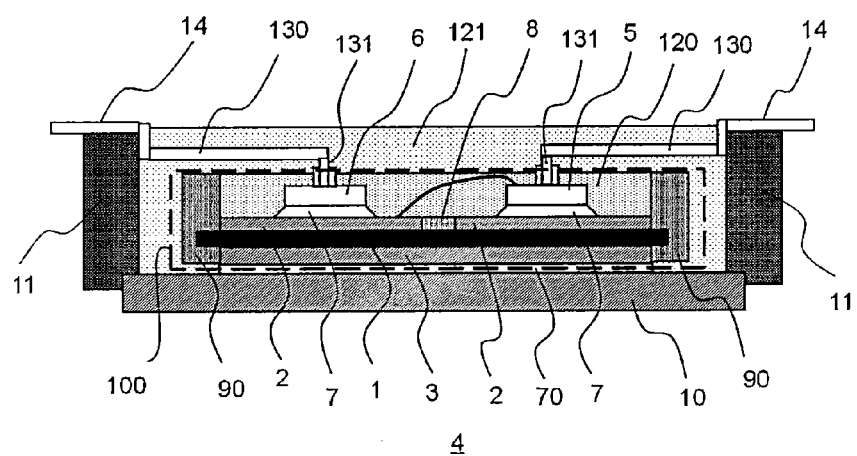
FIG. 8 is a cross-section view showing a basic configuration of a semiconductor device according to EMBODIMENT 4 of this invention.

FIG. 8 is a cross-sectional view showing a basic configuration of a semiconductor device according to EMBODIMENT 4 of this invention. In FIG. 8, the same reference character as that in FIG. 1, FIG. 3, FIG. 5 and FIG. 6 indicates the same or a corresponding part. In EMBODIMENT 4, a socket 131 for connecting a wire to semiconductor elements 5 and 6 is provided. The socket 131 is provided so as to be exposed to a surface of a first sealing resin member 120. According to the above-mentioned configuration, a wire can be inserted to the socket 131 from outside, after the inside of a partition wall is covered with the first sealing resin member 120.

In general, by inserting a metal pin into a metal pipe, a socket can make electrically connection between them; however, it is not limited thereto, any configuration, which can make electrically connection between the semiconductor elements 5 and 6 which are embedded in the first sealing resin member 120 and a wire, is acceptable. Further, on a surface of the socket 131, in order to improve the adhesion with the first sealing resin member 120 or with a second sealing resin member 121, irregularity may be formed, and a chemical treatment using a silane coupling agent may be performed. In general, the socket 131 and the semiconductor element 5 or 6 are electrically connected by using a solder material, however, it is not limited thereto, silver paste or a material which is metallically bonded by sintering is acceptable. In FIG. 8, wiring to the socket 131 is performed by using a copper plate 131; however, it is not needless to say such that a normal linear wire body may be used.

Figure 9:
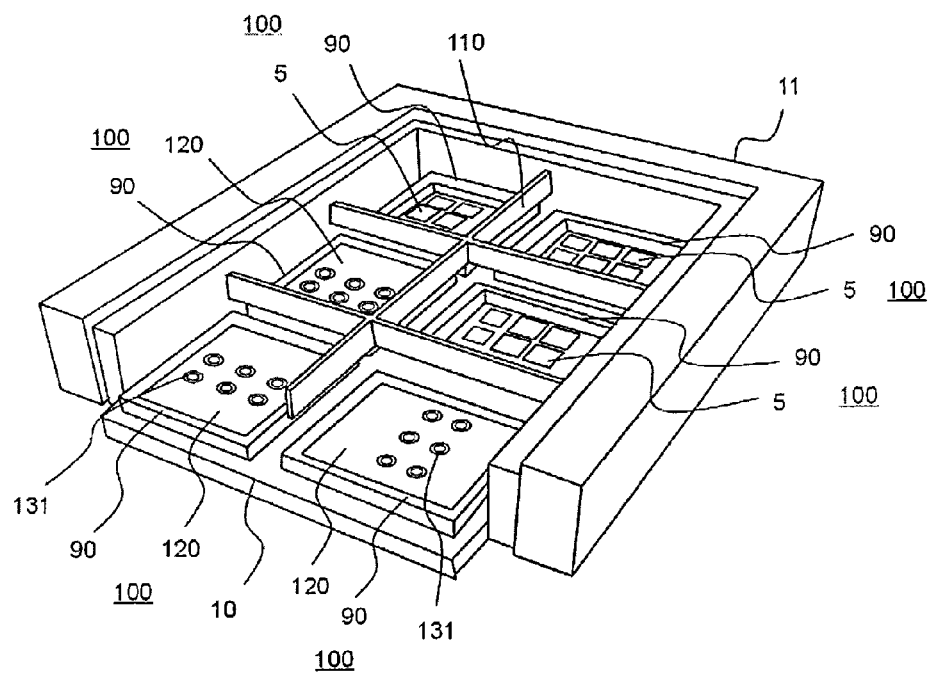
FIG. 9 is a perspective view showing a basic configuration of a semiconductor device which is produced by arranging a plurality of modules of a semiconductor device according to EMBODIMENT 4 of this invention, wherein a sealing resin member and some components are removed.

A part which is indicated by a broken line in FIG. 8, that is, a component wherein the semiconductor elements 5 and 6 are sealed with the first sealing resin member 120 which is injected to the inside of the partition 90 is referred to a module 100. FIG. 9 is a schematic view showing the basic configuration of a semiconductor device wherein a plurality of the modules 100 are arranged in a case side plate 11 so as to constitute one semiconductor device. In FIG. 9, the same reference character as that in FIG. 8 indicates the same or a corresponding part. In FIG. 9, a second sealing resin 121, terminals 14 and wires 130 are removed. Further, in a part of FIG. 9, the first sealing resin member 120 is also removed; therefore, semiconductor elements can be seen. That is, FIG. 9 is a perspective view. In FIG. 9, a bar 110 which is provided between each module is a member for fixing terminals (In FIG. 9, terminals are removed for bridging wires from each module.

According to the above-mentioned configuration, after the semiconductor elements 5 and 6 are sealed with the first sealing resin member 120, and before a module is sealed with the second sealing resin member 121, by supplying an electrical current from the socket 131, operation test of each module 100 can be performed. In operation test, in a case where a defective module is found, a connecting of a semiconductor-element substrate 4 and a base plate 10 can be removed and the defective module can be replaced by non-defective module. As a result, the yield of a semiconductor device can be improved.

Embodiment 5

Figure 10:
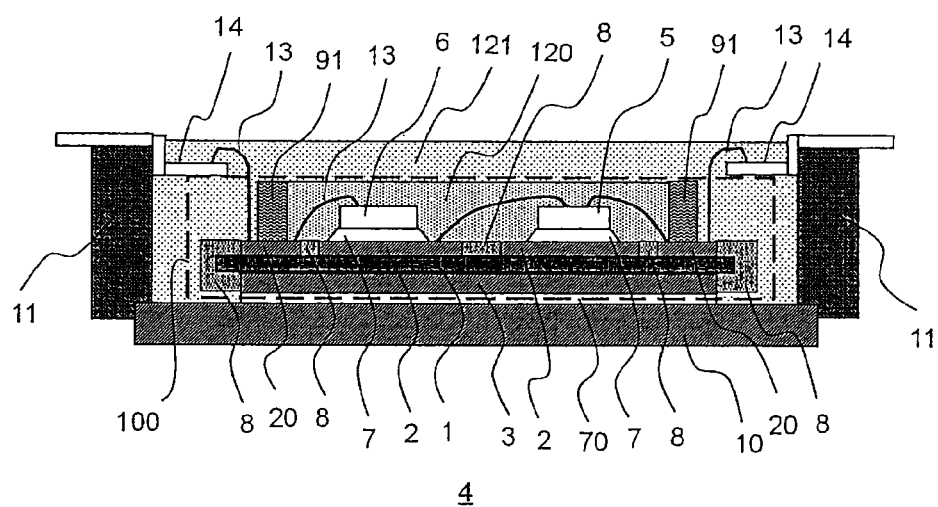
FIG. 10 is a cross-section view showing a basic configuration of a semiconductor device according to EMBODIMENT 5 of this invention.

FIG. 10 is a cross-sectional view showing the basic configuration of a semiconductor device according to EMBODIMENT 5 of this invention. In FIG. 10, the same reference character as that in FIG. 1, FIG. 3, FIG. 5 and FIG. 6 indicates the same or a corresponding part. In EMBODIMENT 5, a partition wall 91 is formed on an electrode pattern 20 which is formed independently from an electrode pattern 2. According to the above-mentioned configuration, by connecting a wire 13 from a part which is the outside of the partition wall 91 of the electrode pattern 20 to a terminal 14, etc. via the independent electrode pattern 20 so as to make electrical connection from inside of the module 100 to the outside of the module 100, the wire 13 is not passed an interface between a first sealing resin member 120 and a second sealing resin member 121. Consequently, even when subjected to heat cycles repeatedly, a wire is hard to be broken. At this time, in order to improve the adhesion with the partition wall 91, irregularity may be formed on a surface of the electrode pattern 20, and a chemical treatment using a silane coupling agent may be performed.

Embodiment 6

Figure 11:
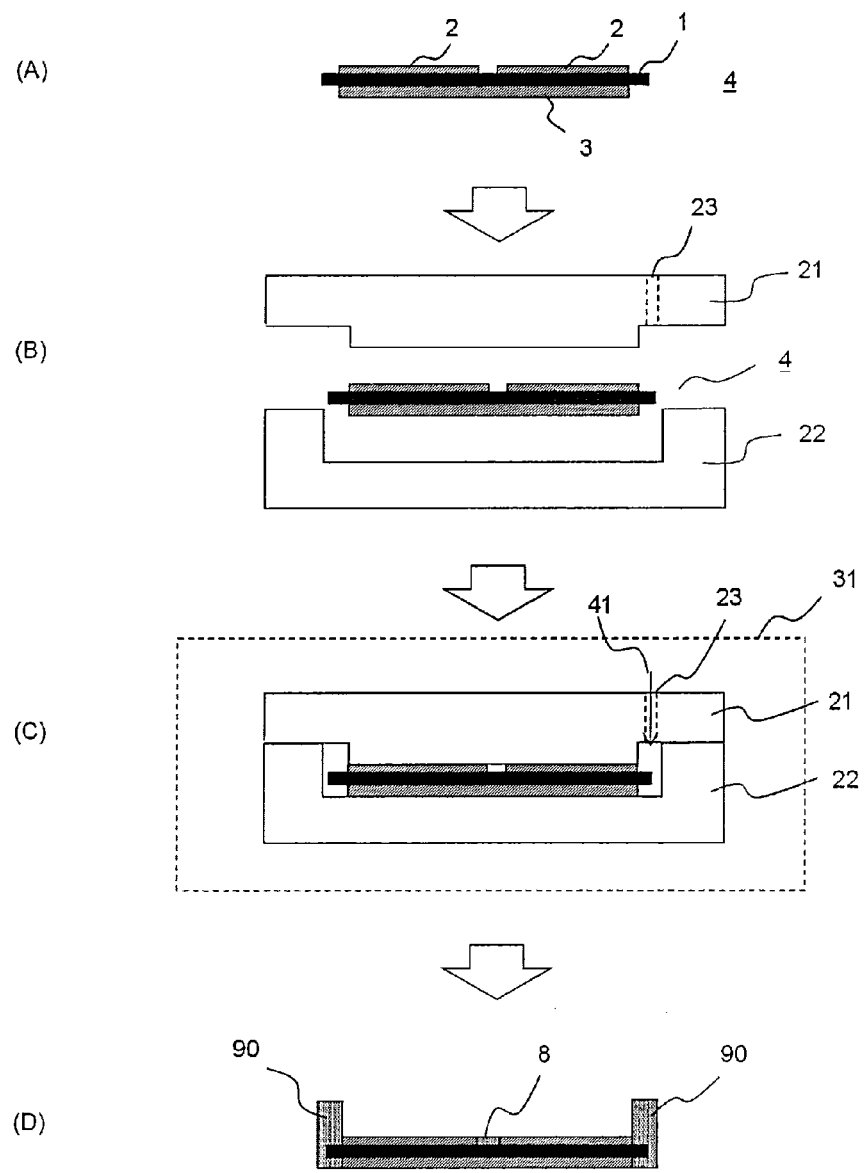
FIG. 11 is pattern diagram showing a method for manufacturing a semiconductor device according to EMBODIMENT 6.

FIG. 11 is pattern diagram showing a method for manufacturing a semiconductor device in this invention. A stress-relaxation adhesive layer and a partition wall are formed by injecting an uncured resin in a syringe and extruding the uncured resin at a necessary point so as to perform drawing, or by using a screen mask. However, according to the above-mentioned methods, it requires a long manufacturing time. According to a method wherein an electrode pattern and a back-surface electrode are sandwiched with a jig having a groove formed therein, and then an uncured resin is injected and cured; a substrate having a various kinds of partition wall can be formed by changing a position and a shape of a groove which is formed in a jig.

First, a semiconductor-element substrate 4, comprising an insulating substrate 1 in which an electrode pattern 2 is formed on a surface and a back-surface electrode 3 is formed on another surface, is prepared (FIG. 11 (A)). Further, a jig comprising an upper jig 21 and a lower jig 22 which are made of Teflon (trademark) is prepared ((FIG. 11 (B)). A resin injection hole 23 for injecting a resin is formed in the upper jig 21. At a predetermined position of the lower jig 22, the semiconductor-element substrate 4 is placed, and the semiconductor-element substrate 4 is covered with the upper jig 21 so as not to be shifted. When a resin is injected afterward, in order to prevent a resin from leaking from the upper and lower jigs, the jigs are sufficiently tightened by using a method such as fixing with screws, hydraulic press, etc. The upper jig 21 and the lower jig 22 should be formed to have enough flatness for a resin not to be leaked to a surface of the electrode pattern 2 and that of the back-surface electrode 3. Then, pressure of inside of the jigs which include the semiconductor-element substrate 4 is reduced to be 10 torr by using a decompression chamber 31, etc. After that, as indicated by an arrow in FIG. 11 (C), an uncured resin 41 is injected from the resin injection hole 23 of the upper jig 21 with the pressing force of approximately 1 MPa. When the resin is injected to the entire part of the space part of the jigs, the pressure of inside of the jigs is returned to be 760 torr (atmospheric pressure), and the resin is thermally cured. For example, in a case where KE1833 which is a silicone resin manufactured by Shin-Etsu Chemical Co., Ltd is used, the resin is cured at 120 degrees Celsius for one hour. After the resin is thermally cured, the jigs are cooled to be a room temperature and the substrate is taken out by dividing the upper and lower jigs. According to the above-mentioned, a substrate in which a stress-relaxation adhesive layer 8 and a partition wall 90 are molded at the same time can be produced (FIG. 11 (D)).

In order for the resin to be injected to entire space part from the resin injection hole 23, a portion of a surface except for an electrode pattern 2 and a back-surface electrode 3 and a portion where the partition wall 90 is formed should be connected by a space inside the jigs. Here, a deaeration hole may be formed in the jigs. Further, it is not needless to say that in order to improve the releasability, a release agent may be coated with a wall surface of a jig, and in addition to Teflon (trademark), other material may be used for a jig.

As above-mentioned, according to a method for manufacturing a semiconductor device of EMBODIMENT 6 of this invention, a stress-relaxation adhesive layer and a partition wall can be formed at the same time; therefore, manufacturing time can be reduced. In addition to that, an interface between them is not formed; therefore, insulation properties can be improved. As a result, a semiconductor device having high reliability can be obtained. Further, as jigs are used, resin cured products having the same shape can be formed with high dimensional accuracy. In addition to the above-mentioned, it is configurated such that spaces of inside of jigs are connected, a stress-relaxation adhesive layer and a partition wall can be formed at the same time, and separation at an interface will not occur. Further, under reduced pressure, a rein is injected by applying pressure, air bubbles are hard to be entrained in the stress-relaxation adhesive layer and the partition wall comprising a low-elasticity resin, adhesion between an insulating substrate, an electrode pattern or a back-surface electrode is improved, and even in a case where heat cycles are caused, separation is hard to occur. As a result, insulation properties are also improved. Further, an electrode pattern and a back-surface electrode are sandwiched by the jigs; influence of surface oxidization due to temperature rise at resin curing is reduced, the effect capable of improving reliability when a semiconductor element or a base material is bonded by a bonding material can be obtained.

Embodiment 7

In EMBODIMENT 7, a semiconductor device module for test is prepared by using various kinds of material for a stress-relaxation adhesive layer and a sealing resin, a power cycle test and a heat cycle test are performed for the semiconductor device module, and obtained results are shown as Examples. In a power cycle test, an electric current is supplied to a semiconductor element until 200 degrees Celsius, when a temperature of the semiconductor element reaches 200 degrees Celsius, supplying of electric current is stopped so as to cool the semiconductor element to be 120 degrees Celsius, and after the semiconductor element is cooled, an electric current is supplied to the semiconductor element again. Further, a heat cycle test is performed by placing the whole of semiconductor device in a thermostatic chamber whose temperature can be controlled, wherein the temperature is repeatedly changed in a range of −40 degrees Celsius to 150 degrees Celsius.

EXAMPLE 1

A power cycle test and a heat cycle test were performed for a semiconductor device having the configuration shown in FIG. 1, that is, the configuration in which a partition wall was not formed and only a stress-relaxation adhesive layer 8 was formed and EX-550 manufactured by Sanyu Rec Co., Ltd. having 7.0 Gpa of modulus of elasticity was used as a first sealing resin member 12. FIG. 12 shows results of the power cycle test and the heat cycle test in which modulus of elasticity of the stress-relaxation adhesive layer 8 was varied.

For producing the semiconductor device, a base plate having the size of 50×92×3 mm, an insulating substrate 1 made of AlN having the size of 23.2×23.4×1.12 mm, a semiconductor element made of SiC having the size of 5×5×0.35 mm, a bonding material made of M731 manufactured by SENJU METAL INDUCTRY CO., LTD., a case side plate which is made of polyphenylene sulfide (PPS) and a wire made of aluminum having a diameter of 0.4 mm were used. Further, in this test, only one SiC semiconductor element was mounted on inside of the module, and the power cycle test and the heat cycle test were performed.

Example 1-1 in FIG. 12 will be described. In a case where the stress-relaxation adhesive layer 8 was prepared by using SE1885 (modulus of elasticity: 15 kPa) manufactured by Dow Corning Toray Co., Ltd, it was found out such that in performing the power cycle test, after 100000 cycles, separation of the first sealing resin member 12 occurred, and in performing the heat cycle test, after 100 cycles, separation of the first sealing resin member 12 and formation of a crack on the first sealing resin member 12 occurred, and as a result, the semiconductor device stopped operating.

In example 1-2, as a result of preparing the stress-relaxation adhesive layer 8 by using SE1886 (modulus of elasticity: 30 kPa) manufactured by Dow Corning Toray Co., Ltd., it was found out such that in the power cycle test, the result was improved up to be 180000 cycles, and in the heat cycle test, the result was improved up to be 600 cycles.

In example 1-3, as a result of preparing the stress-relaxation adhesive layer 8 by using KE1833 (modulus of elasticity: 3.5 MPa) manufactured by Shin-Etsu Chemical Co., Ltd., it was found out such that in the power cycle test, the result was improved up to be 200000 cycles, and in the heat cycle test, the result was improved up to be 1000 cycles.

In example 1-4, when approximately 50 wt % of glass filler was added to KER-4000 manufactured by Shin-Etsu Chemical Co., Ltd. so as to adjust a modulus of elasticity to be 900 MPa, and the stress-relaxation adhesive layer 8 was prepared by using the above-mentioned material, it was found out such that, the device can be operated up to 190000 cycles in the power cycle test and can be operated up to 800 cycles in the heat cycle test.

In example 1-5, when approximately 58 wt % of glass filler was added to KER-4000 manufactured by Shin-Etsu Chemical Co., Ltd. so as to adjust a modulus of elasticity to be 1000 MPa, and the stress-relaxation adhesive layer 8 was prepared by using the above-mentioned material, it was found out such that the result was reduced to be 100000 cycles in the power cycle test and was reduced to be 200 cycles in the heat cycle test.

In example 1-6, when approximately 75 wt % of glass filler was added to KER-4000 manufactured by Shin-Etsu Chemical Co., Ltd. so as to adjust a modulus of elasticity to be 1200 MPa, and the stress-relaxation adhesive layer 8 was prepared by using the above-mentioned material, it was found out such that the result was reduced to be 80000 cycles in the power cycle test and was reduced to be 150 cycles in the heat cycle test.

According to the above-mentioned results, it was found out such that it is proper for the stress-relaxation adhesive layer 8 to have the range of a modulus of elasticity N which is 30 kPa or higher and less than 1 GPa.

EXAMPLE 2

FIG. 13 shows results of tests which were performed on a semiconductor device having the configuration shown in FIG. 5, that is, the configuration in which a stress-relaxation adhesive layer 8 and a partition wall 90 were formed by using the same material. Further, in Example 2, SE1885 (modulus of elasticity: 15 kPa) manufactured by Dow Corning Toray Co., Ltd was used for a second sealing resin member 121. Further, the material of the stress-relaxation adhesive layer 8 and that of the partition wall 90 of example 2-1 to example 2-5 were same as those of example 1-1 to example 1-5 in Example 1, respectively. Based on the results shown in examples 2-1 to example 2-5 in FIG. 13, it was found out such that according to the configuration shown in Example 2, the number of cycles was improved in comparison with Example 1. However, regarding the range of a modulus of elasticity of the stress-relaxation adhesive layer 8 and that of the partition wall 90, the same results as those of Example 1 were obtained.

EXAMPLE 3

A power cycle test and a heat cycle test were performed on a semiconductor device having the configuration shown in FIG. 1, that is, the configuration in which a partition wall was not formed and only a stress-relaxation adhesive layer 8 was formed and KE1833 (modulus of elasticity: 3.5 MPa) manufactured by Shin-Etsu Chemical Co., Ltd., was used for the stress-relaxation adhesive layer 8. FIG. 14 shows results of the power cycle test and the heat cycle test in which a modulus of elasticity of the first sealing resin member 12 was varied.

Example 3-1 in FIG. 14 will be described. Approximately 50 wt % of glass filler was added to KER-4000 manufactured by Shin-Etsu Chemical Co., Ltd. so as to adjust a modulus of elasticity of the sealing resin member to be 900 MPa, and the semiconductor device was sealed with the sealing resin member. It was found out such that in the power test, separation of the sealing resin member occurred after 90000 cycles, and in the heat cycle test, separation of the sealing resin member and formation of a crack on the sealing resin member occurred after 50 cycles, as a result, the semiconductor device stopped operating.

In example 3-2, approximately 58 wt % of glass filler was added to KER-4000 manufactured by Shin-Etsu Chemical Co., Ltd., and a modulus of elasticity of the sealing resin member was adjusted to be 1 GPa, and the semiconductor device was sealed with the sealing resin member. It was found out such that the result was improved up to be 160000 cycles in the power cycle test and was improved up to be 300 cycles in the heat cycle test.

In example 3-3, EX-550 (modulus of elasticity: 7.0 GPa) manufactured by Sanyu Rec Co., Ltd. was used for a first sealing resin member. It was found out such that the result was improved up to be 180000 cycles in the power cycle test and was improved up to be 800 cycles in the heat cycle test.

In example 3-4, approximately 15 wt % of silica filler was added to EX-550 manufactured by Sanyu Rec Co., and a modulus of elasticity of the sealing resin was adjusted to be 12 GPa, and the above-mentioned sealing resin member was used. It was found out such that the result was 160000 cycles in the power cycle test and was 600 cycles in the heat cycle test.

In example 3-5, approximately 20 wt % of silica filler was added to EX-550 manufactured by Sanyu Rec Co., and a modulus of elasticity of the sealing resin was adjusted to be 14 GPa, and the above-mentioned sealing resin was used. It was found out such that the result was 140000 cycles in the power cycle test and was 500 cycles in the heat cycle test.

In example 3-6, approximately 36 wt % of silica filler was added to EX-550 manufactured by Sanyu Rec Co., and a modulus of elasticity of the sealing resin was adjusted to be 20 GPa, and the above-mentioned sealing resin was used. It was found out such that the result was 110000 cycles in the power cycle test and the result was 450 cycles in the heat cycle test.

In example 3-7, approximately 40 wt % of silica filler was added to EX-550 manufactured by Sanyu Rec Co., and a modulus of elasticity of the sealing resin was adjusted to be 22 GPa, and the above-mentioned sealing resin was used. It was found out such that the result was 100000 cycles in the power cycle test and was 200 cycles in the heat cycle test.

According to the above-mentioned results, it was found out such that it is proper for the first sealing resin member to have the range of a modulus of elasticity which is 1 GPa or higher and 20 GPa or lower.

EXAMPLE 4

FIG. 15 shows results of tests which were performed on a semiconductor device having the configuration shown in FIG. 5, that is, the configuration in which a stress-relaxation adhesive layer 8 and a partition wall 90 were formed by using the same material. In performing the tests, KE1833 (modulus of elasticity: 3.5 MPa) manufactured by Shin-Etsu Chemical Co., Ltd., was used for the stress-relaxation adhesive layer 8 and the partition wall 90, and SE1886 manufactured by Dow Corning Toray Co., Ltd. was used for a second sealing resin member 121, and a modulus of elasticity of the first sealing resin member 120 was varied. The first sealing resin members of examples 4-1 to 4-7 were same as those of examples 3-1 to 3-7 in Example 3, respectively. As can be seen from the test results shown in examples 4-1 to 4-7 in FIG. 15, according to the above-mentioned configuration, results of the number of cycles were improved in comparison with those in EXAMPLE 3, however, regarding the range of a modulus of elasticity of the first sealing resin member, the same results as those in EXAMPLE 3 were obtained.

EXAMPLE 5

FIG. 16 shows results of a power cycle test and a heat cycle test which were performed on a test module of a semiconductor device having the configuration in FIG. 5 in which a partition wall 90 was formed. For producing the above-mentioned semiconductor device, a base plate having the size of 85×120×3 mm, an insulating substrate made of $Si_3N_4$ having the size of 23.2×23.4×1.12 mm, a semiconductor element made of SiC having the size of 5×5×0.35 mm, a bonding material made of M731 manufactured by SENJU METAL INDUCTRY CO., LTD., a case side plate which is made of polyphenylene sulfide (PPS) and a wire made of aluminum having a diameter of 0.4 mm were used. In EXAMPLE 5, the test was performed on a test module in which a material of an insulating substrate is different from that in EXAMPLE 4, and the size of a base plate is larger than that in Example 4, and a modulus of elasticity of the first sealing resin member 120 was varied. In performing the test, KE1833 (modulus of elasticity: 3.5 MPa) manufactured by Shin-Etsu Chemical Co., Ltd., was used for the stress-relaxation adhesive layer, and SE1886 manufactured by Dow Corning Toray Co., Ltd. was used for a second sealing resin member 121. The first sealing resin members in examples 5-1 to 5-7 were same as those of examples 4-1 to 4-7 in EXAMPLE 4, respectively. As can be seen by comparing the test results shown in examples 5-1 to 5-7 in FIG. 16 and the test results shown in examples 4-1 to 4-7 in FIG. 15, in EXAMPLE 5, the same results as those in EXAMPLE 4 were obtained.

According to the above-mentioned test results in EXAMPLEs 1 to 5, it was found out such that by using a resin member having a modulus of elasticity of a range which is 1 Gpa or higher and 20 GPa or lower for the first sealing resin member, by using a resin having a modulus of elasticity of a range which is 30 kPa or higher and 1 GPa or less for the stress-relaxation adhesive layer and the partition wall, a semiconductor device having higher reliability in which separation and formation of a crack is hard to occur can be obtained.

REMARKS

1: insulating substrate
2, 20: electrode pattern
3: back-surface electrode
4: semiconductor-element substrate
5, 6: semiconductor elements
7, 70: bonding material
8: stress-relaxation adhesive layer
9, 90, 91: partition wall
10: base plate
11: case side plate 12, 120: first sealing resin member
13: wire
14: terminal
121: second sealing resin member
21: upper jig
22: lower jig
23: resin injection hole

The invention claimed is:

1. A semiconductor device, comprising:
a semiconductor-element substrate, wherein an electrode pattern is formed on one surface of an insulating substrate and a back-surface electrode is formed on the other surface of the insulating substrate;
a stress-relaxation adhesive layer made of resin which covers at least a part of a portion of the surface of the insulating substrate where the electrode pattern and the back-surface electrode are not formed and a part of portion of a surface of the electrode pattern;
a semiconductor element affixed, via a bonding material, to the surface of the electrode pattern opposite the insulating substrate;
a first sealing resin member which covers the semiconductor element and the semiconductor-element substrate; and
a partition wall made of resin whose height is higher than height of the semiconductor element and formed so as to enclose the periphery of the semiconductor-element substrate at a side of the semiconductor-element substrate where the semiconductor element is affixed,
wherein the first sealing resin member fills the inside of the partition wall, a coefficient of linear thermal expansion of the first sealing resin member is closer to a coefficient of linear thermal expansion of the electrode pattern than a coefficient of linear thermal expansion of the insulating substrate, a modulus of elasticity of the stress-relaxation adhesive layer is lower than a modulus of elasticity of the first sealing resin member, and a modulus of elasticity of the partition wall is lower than the modulus of elasticity of the first sealing resin member.

2. A semiconductor device according to claim 1, wherein an area of a portion of the semiconductor-element substrate, where the electrode pattern or the back-surface electrode is not formed, which is covered with the stress-relaxation adhesive layer, is 80% or more of an area where the electrode pattern or the back-surface electrode is not formed.

3. A semiconductor device according to claim 1, wherein an area of the electrode pattern, which is covered with the stress-relaxation adhesive layer, is 50% or less of a surface area of the electrode pattern.

4. A semiconductor device, according to claim 1, wherein the stress-relaxation adhesive layer and the partition wall are made of different resins.

5. A semiconductor device according to claim 1, wherein the stress-relaxation adhesive layer and the partition wall are made of a same resin.

6. A semiconductor device according to claim 1, wherein a plurality of the semiconductor-element substrates are provided, and the partition walls are formed so as to enclose a periphery of each of the semiconductor-element substrates.

7. A semiconductor device according to claim 1, further comprising a second searing resin member which covers the first sealing resin member and the partition wall and whose modulus of elasticity is lower than the modulus of elasticity of the first sealing resin member.

8. A semiconductor device according to claim 1, wherein the modulus of elasticity of the stress-relaxation adhesive layer is in a range of 30 kPa to 1 GPa, and the modulus of elasticity of the first sealing resin member is in a range of 1 GPa to 20 GPa.

9. A semiconductor device according to claim 1, wherein the modulus of elasticity of the stress-relaxation adhesive layer is in a range of 30 kPa to 1 GPa, and the modulus of elasticity of the first sealing resin member is in a range of 1 GPa to 20 GPa.

10. A semiconductor device according to claim 1, wherein the modulus of elasticity of the partition wall is in a range of 30 kPa to 1 GPa, and the modulus of elasticity of the first sealing resin member is in a range of 1 GPa to 20 GPa.

11. A semiconductor device according to claim 1, wherein the semiconductor element is formed of a wide band gap semiconductor.

12. A semiconductor device according to claim 11, wherein the wide band gap semiconductor is a semiconductor selected from a silicon carbide, a gallium nitride based material, and diamond.

13. A method for manufacturing a semiconductor device according to claim 5,
wherein the partition wall and the stress-relaxation adhesive layer are formed by a method comprising:
sandwiching a semiconductor-element substrate by an upper jig and a lower jig having a resin injection hole therein;
placing the semiconductor-element substrate which is sandwiched by the upper and lower jigs in a reduced-pressure environment;
injecting an uncured resin from the injection hole under the reduced-pressure environment; and
taking out the semiconductor-element substrate from the reduced-pressure environment into atmospheric pressure environment, curing the injected resin, and then dividing the upper and lower jigs.

14. A method for manufacturing a semiconductor device according to claim 13,
wherein a surface of the semiconductor-element substrate expect for a part where the electrode pattern and the back-surface electrode are formed and a part where the partition wall is formed is connected by a space inside the jigs.

15. A semiconductor device, comprising: a semiconductor-element substrate, wherein an electrode pattern is formed on one surface of an insulating substrate and a back-surface electrode is formed on the other surface of the insulating substrate;
a semiconductor element affixed, via a bonding material, to the surface of the electrode pattern opposite the insulating substrate;
a partition wall made of resin, whose height is higher than a height of the semiconductor element, and which is formed so as to enclose a periphery of a semiconductor-element substrate, and which is formed at a side of the semiconductor-element substrate where the semiconductor element is affixed;
a first sealing resin member which covers an inside of the partition wall, the semiconductor element and the semiconductor-element substrate,
wherein a coefficient of linear thermal expansion of the first sealing resin member is closer to a coefficient of linear thermal expansion of the electrode pattern than a coefficient of linear thermal expansion of the insulating substrate, and a modulus of elasticity of the partition wall is lower than a modulus of elasticity of the first sealing resin member; and a second sealing resin member which covers the first sealing resin member and the partition wall, and whose modulus of elasticity is lower than the modulus of elasticity of the first sealing resin member.

16. A semiconductor device according to claim 15, wherein the semiconductor element is formed of a wide band gap semiconductor.

17. A semiconductor device according to claim 16, wherein the wide band gap semiconductor is a semiconductor selected from a silicon carbide, a gallium nitride based material, and diamond.

* * * * *

UNITED STATES PATENT AND TRADEMARK OFFICE
CERTIFICATE OF CORRECTION

PATENT NO. : 9,082,707 B2
APPLICATION NO. : 13/880584
DATED : July 14, 2015
INVENTOR(S) : Seiki Hiramatsu et al.

It is certified that error appears in the above-identified patent and that said Letters Patent is hereby corrected as shown below:

On the title page, Item (73), the Assignee's Information is incorrect. Item (73) should read:

--(73) Assignee: Mitsubishi Electric Corporation, Tokyo (JP)--

Signed and Sealed this
Twenty-fourth Day of November, 2015

Michelle K. Lee
*Director of the United States Patent and Trademark Office*